United States Patent [19]

Wieczorek

[11] Patent Number: 5,120,964
[45] Date of Patent: Jun. 9, 1992

[54] DEVICE FOR READING A SENSOR MATRIX

[75] Inventor: Herfried Wieczorek, Aachen, Fed. Rep. of Germany

[73] Assignee: U.S. Philips Corporation, New York, N.Y.

[21] Appl. No.: 628,303

[22] Filed: Dec. 14, 1990

[30] Foreign Application Priority Data

Dec. 21, 1989 [DE] Fed. Rep. of Germany ....... 3942200

[51] Int. Cl.$^5$ ............................................ H01L 27/14
[52] U.S. Cl. ......................... 250/370.08; 250/370.09; 250/211 J; 358/213.23; 358/213.29
[58] Field of Search ........... 250/370.08, 370.09, 250/211 J, 208.1; 358/213.23, 213.29

[56] References Cited

U.S. PATENT DOCUMENTS

| | | | |
|---|---|---|---|
| 4,382,187 | 5/1983 | Fraleux et al. | 250/211 J |
| 4,609,824 | 9/1986 | Munier et al. | 250/211 J |
| 4,689,487 | 8/1987 | Nishiki et al. | 250/361 |

Primary Examiner—Carolyn E. Fields
Assistant Examiner—Drew A. Dunn
Attorney, Agent, or Firm—William Squire

[57] ABSTRACT

A device for reading the charges of several sensor elements (12, 13, 22, ...) which are arranged in a matrix, for each column of sensors there being provided a common read line (82, 83) while for each row of sensors there is provided a common switching line (19, 29, ..., 79). In order to achieve a reduction of the read capacitances for each column of sensors there are also provided several segmented read lines (91, 92, ...) which are connectable to only a few sensor elements (12, 13, 22, ...) of a column, via the switches (2) thereof, and which are individually connectable, via further electric switches (4, 5), to the common read line (82, 83) of the column; for a read operation of a row of sensors, those segmented read lines (91, 92, ...) of each column, which are connected to the activated row of sensors, via the switches (2) thereof are connectable to the common read lines (82, 83).

2 Claims, 1 Drawing Sheet

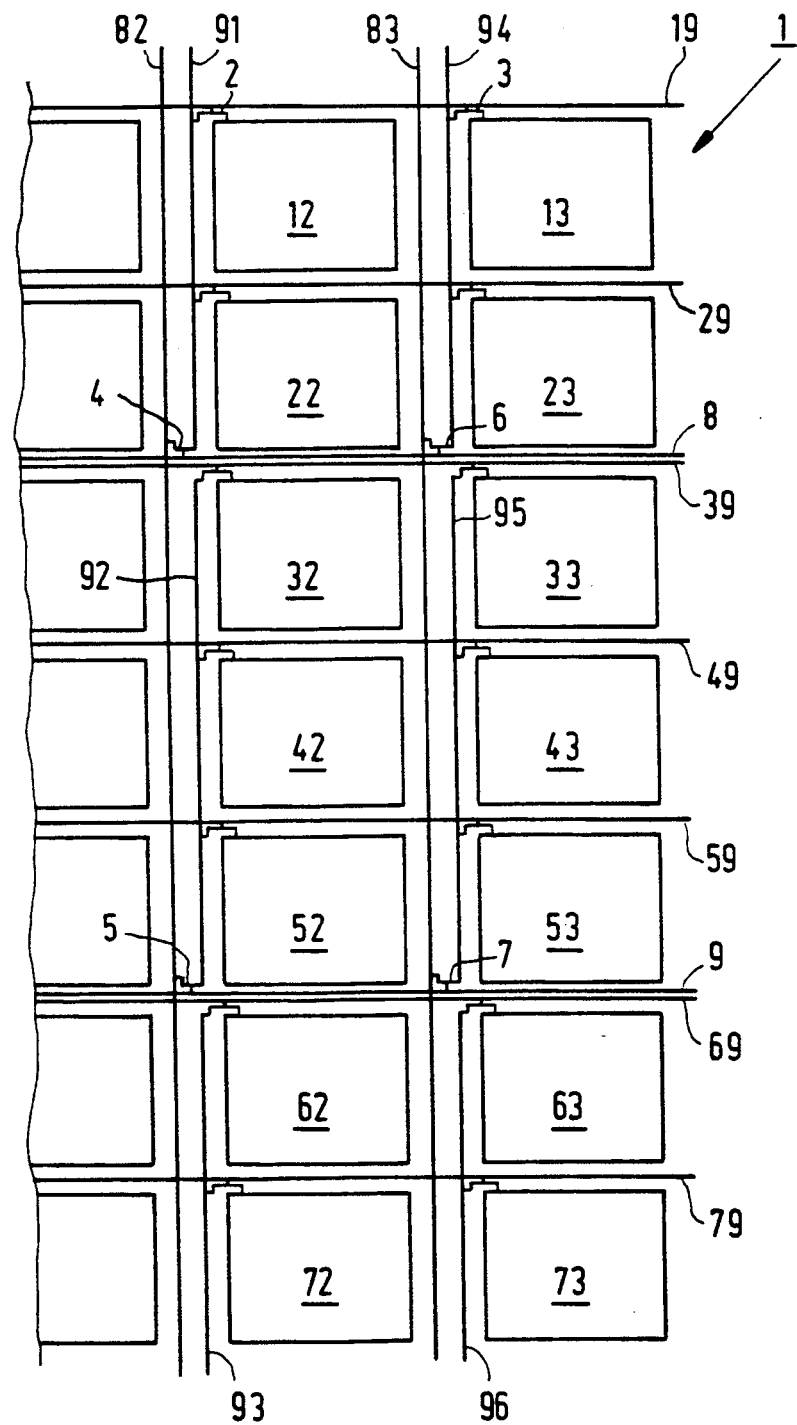

DEVICE FOR READING A SENSOR MATRIX

BACKGROUND OF THE INVENTION

The invention relates to a device for reading charges of several light-sensitive or X-ray sensitive sensor elements which are arranged in rows and columns in a matrix, each sensor element comprising a respective electric switch, for each sensor column there being provided a common read line while for each sensor row there is provided a switching line via which the switches of the sensors can be activated so that the charges of the sensor elements of the activated row are output via the read lines.

A device of this kind is known, for example from DE-OS 35 31 448 which corresponds to U.S. Pat. No. 4,689,487. The cited document describes a matrix of photocells for an X-ray imaging apparatus, the charges of the photocells being read in that the switches associated with each sensor are activated via a switching line provided per row. The reading of the charges stored in the sensor is column-wise performed via a respective common read line. In devices of this kind a problem is encountered in that the parasitic capacitances of the read lines and the switches, via which the charge of each sensor element is read, have an adverse effect on the signal read.

SUMMARY OF THE INVENTION

It is an object of the invention to provide a device of the kind set forth which is improved as regards the involved problem.

This object is achieved in accordance with the invention in that for each sensor column there are also provided several segmented read lines, each of which can be connected, via the relevant switches, to a few sensor elements of a column only, and which can be individually connected, via further electric switches, to the common read line of their column, and in that for a read operation of a sensor row only the segmented read lines which are connected to the activated sensor row via their switches are connectable to the common read lines in each column.

In each of the sensor elements of the matrix a charge is stored which corresponds to the amount of light or X-ray incident on the sensor element during a given period of time. This stored charge is read via electric switches, one of which is provided for each sensor element. For each sensor element row there is provided a switching line. When an appropriate switching signal is issued on one of these switching lines, the switches of the sensor elements of this row are activated and the charges stored in the sensor elements are read. This is realize via read lines, one of which is provided for each column of sensor elements. A problem is then encountered in that during the reading of a row of sensor elements, in each column all switches of the sensor elements present therein are connected to the read line. Even when all switches are closed, with the exception of those of the sensor row just read, they exhibit parasitic capacitances, like the read line itself, whereby noise is superposed on the signal read.

In the device in accordance with the invention this problem is mitigated in that, besides the common read line, for each individual column of the sensor matrix there are provided several segmented read lines. The segmented read lines comprise switches via which they can be connected to the common read line. The individual sensor elements of the relevant column are no longer connected to the common read line, but to the segmented read lines. Each time only a few of the switches of the sensors of a column are connected to a segmented read line. For example, when a column comprises nine sensor elements, there may be provided three segmented read lines whereto each time three sensor elements can be connected via their switches.

For a read operation, the switches of the sensor element of a row are activated via a switching line provided for each row. The read operation is performed so that the sensor elements present in the relevant sensor row are connected to the relevant associated segmented read lines. The segmented read lines themselves are connected to the common read line via further electric switches. An improved noise behavior is then obtained, because each segmented read line is connected to only a comparatively small part of the switches of the sensor elements of a column. The common read line also comprises comparatively few switching elements, because only as many switching elements are required as there are segmented read lines. The improved noise behavior in this device is more pronounced as more sensor elements are present in a column. Because practical devices usually comprise more than one thousand sensor elements in a column, noise is substantially reduced in such cases.

The manufacture of the additional electric switches required for the segmented read lines can be realized together with the other electric switches in a common manufacturing process if, as in accordance with a further version of the invention, electric switches in the form of thin-film transistors are provided for the sensor elements as well as for the segmented read lines.

IN THE DRAWING

An embodiment in accordance with the invention will be described in detail hereinafter with reference to the sole FIGURE.

The FIGURE shows a part of a sensor matrix which may comprise, for example a total of two thousand sensor elements per column and per row. Such a sensor matrix can be used, for example in high resolution radiography.

DESCRIPTION OF THE PREFERRED EMBODIMENT

The part of the sensor matrix 1 which is shown in the Figure comprises sensor elements 12, 13, 22, 23, ..., 73. These sensor elements are arranged in rows and columns in a matrix. The sensor elements themselves are only diagrammatically indicated in the Figure. When such a sensor matrix is to be used, for example for radiography, the sensor elements are X-ray sensitive elements which comprise a sensor which is not shown in the Figure and which serves to store a charge in a capacitance provided in each sensor element. The stored charge is proportional to the amount of radiation incident during a predetermined period of time.

Each of the sensor elements shown in the Figure comprises an electric switch 2 which may be, for example a thin-film transistor.

These thin-film transistors 2 can be fabricated together with the sensor elements 12, ..., 73 in a common manufacturing process.

In the broken-away representation of the Figure, for the first row of a matrix only the sensor elements 12 and 13 are shown. The same holds for the other rows in which two sensor eleemnts are shown. Furthermore, the Figure shows seven sensor elements for each column. For example, a column comprises the sensor elements 12, 22, 32, 42, 52, 62 and 72.

The sensor elements of a row, or more exactly speaking their electric switches 2, are activated via a respective corresponding switching line 19, 29, 39, 49, 59, 69 or 79 associated with the relevant row. Thus, in the embodiment shown in the Figure the switches 2 of the two sensor elements 12 and 13 are activated via the switching line 19 provided for this row. The same holds for the further switching lines 29, 39, 49, 59, 69 and 79 for the further rows.

For each column of sensor elements there is provided a common read line. For the column of sensor elements 12, 22, 32, 42, 52, 62, 72 this is the common read line 82. The common read line 83, is provided for the column of sensor elements 13, 23, 33, 43, 53, 63, 73.

For each column, however, several segmented read lines are also provided. For example, the sensor elements 12 and 22 are connected to a segmented read line 91 which is connected to the common read line 82 of this column via an electronic switch 4 which may be a thin-film transistor like the electronic switches 2. To this end there is provided a switching line 8 via which the switches 4 and 6 of the segmented read lines 91 and 94, respectively, are activated. The further sensor elements 32, 42 and 52 present in this column are connected, by way of their switches 2, to the segmented read line 92 which is connected, via an electronic switch 5, to the common read line 82 of this column. To this end there is provided a switching line 9 via which the electric switches 5 of the segmented read line 92 and the electric switches 7 of the segmented read line 95 are activated. In the broken-away view of the Figure, a further segmented read line 93 is indicated for the further sensor elements 62 and 72 of this column, the segmented read line 93 also being connected to the common read line 82 in a manner not shown in the Figure. A further segmented read line 96 is coupled to sensor elements 63 and 73 and to switch 3 activated via switching line 79 in a manner similar to that discussed above. Further sensor elements, which may be present in this column but not shown in the Figure, are similarly connected to the common read line 82 of this column via segmented read lines. For this purpose there are provided further switching lines for activating the switches of the segmented read lines so that the segmented read lines can be connected to the relevant common read line.

For example, when the sensor elements of the third row, i.e. the sensor elements 32 and 33 in the Figure, are to be read, their electric switches 2 should be activated via the switching line 39. The charge of the sensor element 32 can then flow via the segmented read line 92 and that of the sensor element 33 can flow via the segmented read line 95. Because only the switching line 39 is activated, in this case only the switches associated with these sensor elements are activated. All other switches of sensor elements in other rows are blocked. The segmented read lines 92 and 95 are activated for the read operation via their associated electric switches 5 and 7, respectively, using a corresponding switching signal on the switching line 9, so that the segmented read line 92 is connected to the common read line 82 provided for this column. The same holds for the segmented read line 95 which, after activation of the switch 7, is connected to the common read line 83 provided for this column. Thus, the charge of the sensor element 32 flows to the segmented read line 92, via its electric switch 2, and further, via the electric switch 5, to the common read line 82. The same holds for the sensor element 33 and any other sensor elements present in this row but not shown in the Figure.

A corresponding read operation can be successively performed in all rows; each time the read lines associated with the row to be read and provided for each column have to be connected to the common read line.

The improved noise behavior because of the lower parasitic capacitances is achieved in that the common read line of each column is connected to the segmented read lines via comparatively few electric switches only. Each segmented read line itself is connected to only a few sensor elements of the column. As a result, during a read operation via a segmented line and a common read line, the two lines are connected to a number of electric switches which is substantially lower than the number of sensor elements present in the relevant column. This effect is more pronouned as there are more sensor elements present in each column. This effect already becomes apparent from the part of a matrix shown in the Figure, because in this example the read line in the prior-art device would be connected to the seven elements of a column via seven switches. According to the solution in accordance with the invention, however, a segmented read line is provided with three switches only and the common read line is provided with two switches, so that an advantage is already achieved for this comparatively small device. In the case of larger devices, comprising for example two thousand sensor elements per column, a reduction of the capacitance in the read lines of each column by approximately a factor of from 6 to 7 is achieved in accordance with the invention.

I claim:

1. A device for reading charges of a plurality of radiation sensitive sensor elements arranged in rows and columns of a matrix comprising:
   a plurality of said sensor elements in said matrix, each element including a first electric switch;
   a plurality of read lines, each corresponding to a different column for reading the sensors of that column;
   a plurality of switching lines, each corresponding to a different row for activating the switches of the corresponding row;
   a plurality of groups of segmented read lines, each group corresponding to a sensor column, each segmented read line of a group corresponding to and coupled to the first switches of a group of sensor elements of that column, each group of sensor elements corresponding to a different segmented read line; and
   a plurality of second electric switches for coupling each segmented read line to that one of said plurality of read lines corresponding to a given column such that for a read operation of a sensor row only the segmented read lines connected to the activated sensor row via said first electric switches are electrically coupled to the corresponding read line of that column.

2. The device of claim 1 wherein said first and second electric switches comprise thin-film transistors.

* * * * *